(12) United States Patent
Terai

(10) Patent No.: US 6,612,863 B2
(45) Date of Patent: Sep. 2, 2003

(54) CONNECTING STRUCTURE FOR A CONNECTOR-FLEXIBLE CABLE AND FLEXIBLE CABLE WITH PERFORATED SLITS

(75) Inventor: Hiroshi Terai, Osaka (JP)

(73) Assignee: Funai Electric Co., Ltd. (JP)

( * ) Notice: Subject to any disclaimer, the term of this patent is extended or adjusted under 35 U.S.C. 154(b) by 0 days.

(21) Appl. No.: 10/021,953

(22) Filed: Dec. 13, 2001

(65) Prior Publication Data
US 2002/0076953 A1 Jun. 20, 2002

(30) Foreign Application Priority Data
Dec. 18, 2000 (JP) ......................................... 2000-383841

(51) Int. Cl.[7] ................................................ H01R 12/24
(52) U.S. Cl. ................... 439/492; 439/499; 174/117 F; 174/117 FF
(58) Field of Search ................................. 439/198, 492, 439/499; 174/117 F, 117 FF

(56) References Cited

U.S. PATENT DOCUMENTS

| 4,143,935 | A | * | 3/1979 | Goodman et al. | .......... 439/405 |
| 4,460,804 | A | * | 7/1984 | Svejkovsky | ............. 174/117 A |
| 4,470,195 | A | * | 9/1984 | Lang | ............................ 29/825 |
| 4,551,579 | A | * | 11/1985 | Takaaki | .................... 174/88 R |
| 5,304,741 | A | * | 4/1994 | Proulx | ................... 174/117 FF |
| 6,020,559 | A | * | 2/2000 | Maeda | .................... 174/117 F |
| 6,452,754 | B1 | * | 9/2002 | Mizuta et al. | ........... 360/266.3 |
| 2001/0011603 | A1 | * | 8/2001 | Ueno | ......................... 174/117 |

FOREIGN PATENT DOCUMENTS

JP 5-1095 1/1993

* cited by examiner

Primary Examiner—Michael C. Zarroli
(74) Attorney, Agent, or Firm—Rosenthal & Osha L.L.P.

(57) ABSTRACT

Perforated slits are formed lengthwise between lead wires in a band portion which continue to a connector inserted portions with buried lead wires in a plurality of rows, the perforated slit is made long in the connector inserted portion and short in the band portion, a flexible cable may be separated into two or more pieces as needed at the perforated slit, and small projecting parts are defined for fitting in notches at edges of the connector inserted portion, where the connector inserted portion is inserted into said connector at one end.

3 Claims, 2 Drawing Sheets

CONNECTING STRUCTURE FOR A CONNECTOR-FLEXIBLE CABLE AND FLEXIBLE CABLE WITH PERFORATED SLITS

BACKGROUND OF INVENTION

The present invention relates to a connecting structure between a connector and a flexible cable which enables separation of a connector inserted portion and a band portion in a lengthwise direction such that the portions are not easily dislodged.

An existing flexible cable typically has a fixed number of lead wires buried in a plurality of rows and so a flexible cable typically requires a connector with the same sort and the same number of pins as those of the lead wires buried in the plurality of rows.

Additionally, a flexible base as described in the Examined Japanese Utility Model Application Publication No. Hei5-1095 is shown in FIGS. 4A, 4B and 5. The flexible base has a slit 101b with V-shaped edges and V-shaped cutting portions 101a, 101c are located on sides of the flexible base. The points of the V-shaped cutting portions 101a, 101c are located a slight distance from the points of the V-shaped edges of the slit 101b. A copper foil 102 is shielded around the V-shaped cutting portions 101a, 101c and the slit 101b.

However, as seen in FIGS. 4A and 4B, the widths of the cutting portions 101a, 101b are large and both edges are shaped in V, therefore, breakage may occur at these parts and may also be easily dislodged.

SUMMARY OF THE INVENTION

In one or more embodiments, it is an object of the invention to offer a connecting structure for a connector and a flexible cable, in which the connector has a different pin number than the flexible cable, and where the same flexible cable separated at a perforated slit, such that the flexible cable is not unnecessarily dislodged.

A first aspect of the invention is a connecting structure of a connector and a flexible cable. The flexible cable is characterized in that perforated slits are formed lengthwise between lead wires. The lead wires in a band portion continue to a connector inserted portion. The connector-inserted portion has buried lead wires in a plurality of rows. The perforated slit of the flexible cable is made long in the connector inserted portion and short in the band portion. The flexible cable may be separated into two or more pieces as needed at the perforated slit. Small projecting parts in the connector are defined for fitting in notches at edges of the connector inserted portion such that the connector inserted portion is inserted into the connector at one end.

A second aspect of the invention is a connecting structure for a connector and a flexible cable. The flexible cable characterized in that perforated slits are formed lengthwise between lead wires. The lead wires in a band portion continue to a connector inserted portion. The connector inserted potion has buried lead wires in a plurality rows. The flexible cable may be separated into two pieces or more as needed at the perforated slit.

A third aspect of the invention is a flexible cable. The flexible cable characterized in that a band portion is separated from a perforated slit of a connector inserted portion, such that the band portion and the connector inserted portion are separated into one or more forks from the connector inserted portion which is not separated from the other end.

BRIEF DESCRIPTION OF THE DRAWINGS

FIG. 1A is a front view thereof, FIG. 1B is a front view of the condition where the flexible cable, and FIG. 1C is the side view of the same;

FIG. 4A is a partially enlarged plan view, and FIG. 4B is a plan view showing a whole structure.

DETAILED DESCRIPTION OF THE PREFERRED EMBODIMENTS

Explanation will be made of an embodiment of the flexible cable according to the invention, in reference to the attached drawings.

Figure 1A:
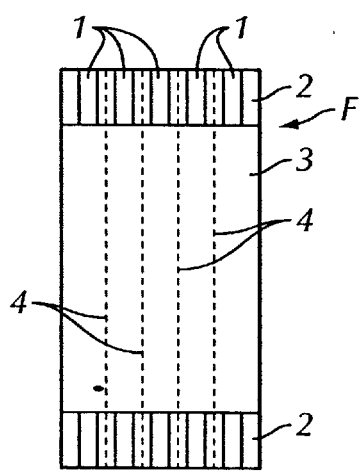
FIGS. 1A to 1C shows an embodiment of a flexible cable of the invention.
Figure 1B:
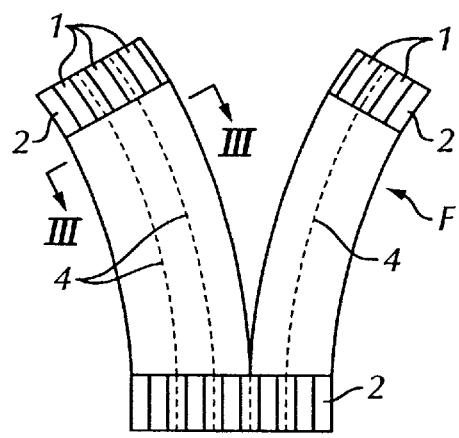
Figure 1C:
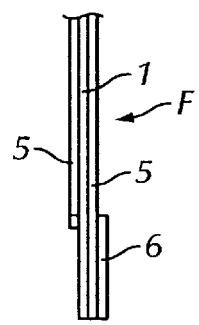

FIG. 1 shows an embodiment of a flexible cables of the invention, and FIG. 1A is a front view thereof, FIG. 1B is a front view of a condition that the flexible cable of one end is branched in fork at the connector inserted portion into a band portion and the connector inserted portion of another end, and FIG. 1C is a side view of the same.

The flexible cable of the embodiment, as shown in FIGS. 1A, B and C, has a structure where perforating slits are formed in the lengthwise direction between the lead wires 1 of the band portion 3 which continue to the connector inserted portion 2 with buried lead wires in the plurality of rows. The perforated slit is made long in the connector inserted portion 2 and short in the band portion 3, and the flexible cable is separated at the perforated slits 4, as needed into a plurality piece, e.g., two pieces.

As shown in FIG. 1B, the flexible cable is separated from the perforated slits 4 of the band portion 3 and the connector inserted portion 2 of one end, so that the band portion 3 and the connector inserted portion 2 are separated into a plurality of (III) pieces at the connector inserted portion 2 of an end which is not separated.

As shown in FIG. 1C, the flexible cable F is formed in a manner that the center lead wire 1 is pasted with tapes 5 at both sides and an outermost plate 6 in the thickness.

Figure 2:
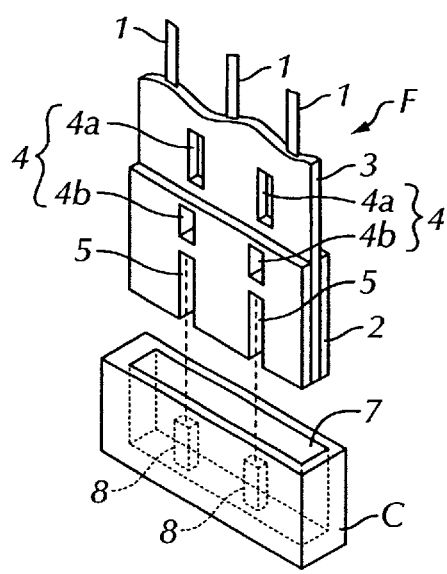
FIG. 2 is a partially perspective view of the connecting structure of the connector and the flexible cable according to the embodiment of the invention.
Figure 3:
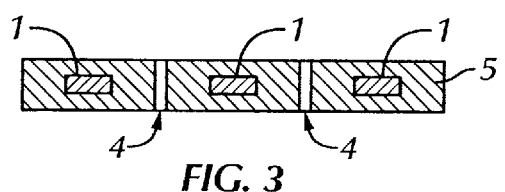
FIG. 3 is a sectional view cut at the section III in FIG. 1B.
Figure 4A:
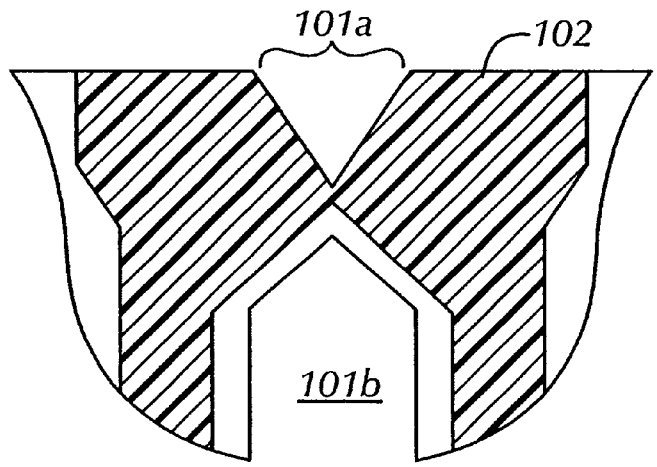
FIGS. 4A and 4B show an existing flexible cable base plate.
Figure 4B:
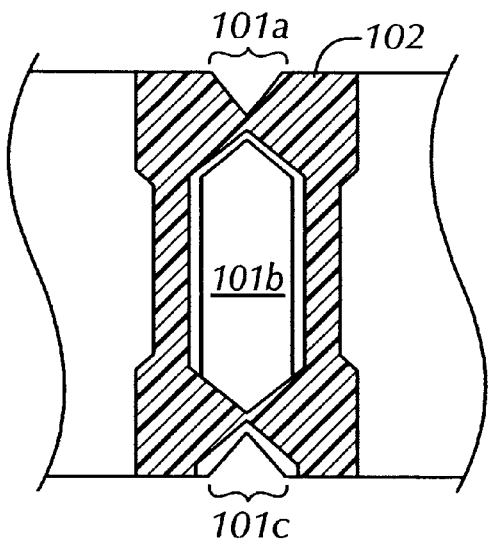
Figure 5:
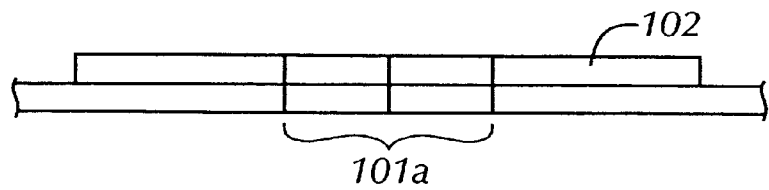
FIG. 5 is a front view of the existing flexible base.

Therefore, according to the flexible cable F of the embodiment, the same flexible cable F is separated at the perforated slit 4 and connected to the connector C having different pin number (refer to FIG. 2). Furthermore, the connector C may not be unnecessarily dislodged.

The perforated slits 4 in the lengthwise direction are made long 4A in the connector inserted portion 2 and short 4B in the band portion 3.

FIG. 2 is a partial perspective view of the connecting structure of the connector C and the flexible cable F according to the embodiment of the invention.

This structure also has small projecting parts 8 to be fitted in notches 5 at the edges of the connector inserted portion 2 within the interior of a connecting recess 7 of the connector C for inserting the connector inserted portion 2 in one end of the flexible cable F.

Therefore, when inserting the connector inserted portion 2 in one end of the flexible cable F into the connecting recess 7 of the connector, the notches 5 of the connector inserted portion 2 are fitted into the small projecting parts 8 of the connecting recess 7, so that the flexible cable F is made difficult to dislodge.

As explained above, the first aspect of the invention is a connecting structure for the connector C and the flexible cable F, wherein the perforated slits 4 are formed lengthwise between the lead wires 1 in the band portion 3 which continue to the connector inserted portion 2 with buried lead wires in a plurality of rows. The perforated slit 4 is made long 4A in the connector inserted portion and short 4B in the band portion 3, such that the flexible cable F may be separated into two pieces or more as needed at the perforated slit 4. Small projecting parts 8 are defined for fitting in the notches at edges of the connector inserted portion 2 such that the connector inserted portion 2 is inserted into the connector C at one end, and therefore, the invention has effects as previously mentioned.

That is, the connector C having a different pin number may be applied with the same flexible cable that is separated at the perforated slit 4. Accordingly, the flexible cable F does not dislodge unnecessarily.

Further, the perforated slit 4 is made long 4A in the connector inserted portion 2 and short 4B in the band portion 3, so that the connector inserted portion 2 is difficult to dislodge.

When inserting the connector inserted portion 2 at one end of the flexible cable F into the connecting recess 7 of the connector C, the notches 5 of the connector inserted portion 2 are fitted into the small projecting parts 8 of the connecting recess 7, so that the flexible cable F is difficult to dislodge.

The second aspect of the invention is the connecting structure for the connector C and the flexible cable F, where the perforated slits 4 are formed lengthwise between the lead wires 1 in the band portion 3 which continue to the connector inserted portion 2 with buried lead wires in a plurality of rows. The flexible cable F may be separated into two or more pieces as needed at the perforated slit 4.

That is, the connector C having a different pin number may be applied with the same flexible cable F that is separated at the perforated slit 4, such that the flexible cable F is not dislodged unnecessarily.

The third aspect of the invention is the flexible cable F where the band portion 3 is separated at the perforated slit 4 of the connector inserted portion at one end, so that the band portion 3 and the connector inserted portion are separated into a fork at the connector inserted portion 2 of the end which is not separated, so that a thick connector inserted portion 2 is difficult to be dislodged.

What is claimed is:

1. A connecting structure for a connector and a flexible cable, said connecting structure, comprising:

a connector inserted portion; and a band portion having buried lead wires in a plurality of rows which continue to said connector inserted portion, wherein perforated slits are formed lengthwise between said lead wires, the perforated slits being made long in said connector inserted portion and short in said band portion, wherein the flexible cable is capable to be separated into two or more pieces as needed at the perforated slit, and wherein said connector inserted portion provides notches for fitting in small projecting parts within said connector.

2. A flexible cable, comprising:

a connector inserted portion; and a band portion having buried lead wires in a plurality of rows which continue to said connector inserted portion, wherein perforated slits are formed lengthwise between said lead wires, the perforated slits being made long in said connector inserted portion and short in said band portion, and wherein the flexible cable is capable to be separated into two or more pieces as needed at the perforated slit.

3. The flexible cable as in claim 2, wherein said band portion is separated from the perforated slit of said connector inserted portion of one end, so that said band portion and said connector inserted portion are separated into one or more forks from said connector inserted portion of an end which is not separated.

* * * * *